(12) United States Patent
Luo et al.

(10) Patent No.: US 6,885,108 B2
(45) Date of Patent: Apr. 26, 2005

(54) PROTECTIVE LAYERS FORMED ON SEMICONDUCTOR DEVICE COMPONENTS SO AS TO REDUCE OR ELIMINATE THE OCCURRENCE OF DELAMINATION THEREOF AND CRACKING THEREIN

(75) Inventors: Shijian Luo, Boise, ID (US); Tongbi Jiang, Boise, ID (US); S. Derek Hinkle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/391,267

(22) Filed: Mar. 18, 2003

(65) Prior Publication Data

US 2004/0183210 A1 Sep. 23, 2004

(51) Int. Cl.[7] .................................................. H01L 29/40
(52) U.S. Cl. ........................................ 257/778; 257/701
(58) Field of Search ................................ 257/780, 778, 257/698, 737, 738, 701, 787

(56) References Cited

U.S. PATENT DOCUMENTS 5,977,641 A * 11/1999 Takahashi et al. .......... 257/778
6,064,114 A * 5/2000 Higgins, III ................ 257/698
6,187,615 B1 2/2001 Kim et al.

* cited by examiner

*Primary Examiner*—Roy Potter
(74) *Attorney, Agent, or Firm*—TraskBritt, PC (57) ABSTRACT

A method for forming protective layers on a plurality of semiconductor device components carried by a fabrication substrate includes applying a layer of protective material to surfaces of the semiconductor device components. The layer of protective material is then severed and the fabrication substrate is at least partially severed. Cracks and delaminated regions that are formed during severing are then healed. The protective material may be applied as a preformed sheet or in a liquid form, then at least partially cured or hardened. If a curable polymer is employed as the protective material, it may be partially cured before severing is effected, then self-healed before being fully cured. Alternatively, a thermoplastic material may be used as the protective material, with healing being effected by heating at least regions of the thermoplastic material. Semiconductor device components, including chip-scale packages, which are formed by the method are also disclosed.

33 Claims, 4 Drawing Sheets

PROTECTIVE LAYERS FORMED ON SEMICONDUCTOR DEVICE COMPONENTS SO AS TO REDUCE OR ELIMINATE THE OCCURRENCE OF DELAMINATION THEREOF AND CRACKING THEREIN

BACKGROUND OF THE INVENTION

1. Field of the Invention

The present invention relates generally to methods for simultaneously applying protective layers to a plurality of semiconductor device components, or wafer-scale application of protective layers to semiconductor device components. More specifically, the present invention relates to methods for forming protective layers in which any delamination thereof or cracking therein that occurs during scribing, cutting, severing, or dicing of at least the protective layers is subsequently healed.

2. Background of Related Art

Due to the ever-decreasing dimensions of electronic devices, state-of-the-art electronic devices require components, including semiconductor devices, of ever-decreasing size and ever-increasing density.

One approach that has been taken to reduce the amount of area, or "real estate," consumed by semiconductor devices has been to reduce the amount of packaging that is required therefor. Thus, so-called "chip-scale packages" ("CSPs"), which typically comprise semiconductor device packages with lateral (i.e., x-axis and y-axis) dimensions that are not much larger than, or are substantially the same size as, the corresponding lateral dimensions of the semiconductor dice thereof have been developed. In order to fabricate a semiconductor device package with such small dimensions, a minimal amount of protective, encapsulant material is typically used. Thus, the protective, encapsulant material may cover only the active surface of the semiconductor die. Additionally, a CSP may include a thin layer of protective, encapsulant material that covers the backside of the semiconductor die.

Such protective, encapsulant layers are typically formed at a "wafer scale," meaning that they are formed prior to singulating, or dicing, semiconductor devices from a large-scale semiconductor substrate upon which multiple semiconductor devices have been fabricated. For example, a single layer of protective, encapsulant material may be disposed on a large-scale semiconductor substrate and spread over at least active surfaces of a plurality of the semiconductor devices that are carried by the semiconductor substrate. Such spreading may be effected by use of spin-on processes, use of a so-called "doctor blade," spray-on techniques, screen printing, or the like. The protective encapsulant material is then cured or hardened to form a protective, encapsulant layer on surfaces of the semiconductor devices.

When a layer of protective, encapsulant material is formed over the entire surface of a large-scale semiconductor substrate, including on the "streets" that are located between adjacent semiconductor devices, it is necessary to cut through the protective, encapsulant layer to singulate, or dice, the semiconductor devices from one another. As such singulating or dicing is effected, the protective, encapsulant layer and the underlying substrate are subjected to mechanical stresses. These mechanical stresses cause the formation of microcracks in the protective, encapsulant layer, as well as delamination of regions of the protective, encapsulant layer from corresponding surfaces of the semiconductor device. Such cracks and delaminated regions may be problematic during subsequent stressing, testing, or use of the resulting CSP since the associated repeated heating and cooling of the semiconductor die thereof may further stress the protective, encapsulant layer, increasing the sizes of cracks and causing further delamination. In addition, as is well known in the art, the existence of cracks and delaminated regions in a protective encapsulant provides a pathway for potentially damaging contaminants through the protective encapsulant, and could ultimately result in failure of the packaged semiconductor die.

The inventors are not aware of CSPs that are substantially free of microcracks and delaminated regions or of a method by which such CSPs may be fabricated.

SUMMARY OF THE INVENTION

The present invention includes a method for applying protective layers which are substantially free of separated, or delaminated, areas and cracks substantially simultaneously to a plurality of semiconductor device components. The result of a method that incorporates teachings of the present invention is a semiconductor device component with a protective layer thereon which is substantially free of separated, or delaminated, areas and cracks (e.g., a chip-scale package when the semiconductor device component comprises a semiconductor device).

In general, a method according to the present invention includes applying a protective layer to upper surfaces of a plurality of semiconductor device components, such as semiconductor devices, interposers, or carrier substrates, that are carried by a fabrication substrate. Once the protective layer is formed, if it comprises a so-called "B-stageable," or "B-stage," polymer, such as an epoxy, an acrylic, or a polyurethane, it may, by way of example only, be partially cured or solidified. B-stage materials are materials that can become substantially tack-free and at least semisolid at room temperature. As known in the art, various mechanisms may be used to "B-stage" a cross-linkable polymer. By way of example only, solvent may be driven at least partially out of a polymer-solvent solution to cause the same to at least partially solidify or cure. As another example, a curable polymer may be at least partially cured to "B-stage" the same. As an alternative to a B-stage material, a thermoplastic material may be used to form the protective layer. Of course, a thermoplastic material may be at least partially hardened, or solidified, following application thereof to the upper surfaces of a plurality of semiconductor device components.

The protective layer is then cut while the underlying fabrication substrate is scribed, or partially cut, or fully cut, severed, or diced. When mechanical cutting means are employed to effect such scribing, cutting, severing, or dicing, areas of the protective layer may be separated, or delaminated, from the upper surfaces of the semiconductor device components. In addition, cracks may form in the protective layer.

As any such separation, or delamination, and cracking may undesirably affect the integrity of the resulting semiconductor device component, the present invention includes processes for healing any delamination of the protective layer and any cracks that have formed therein. When the protective layer is formed from a partially cured, cross-linkable material, such as a B-stage material, any delamination or cracks may self-heal. Self-healing may be facilitated by application of one or more of heat, a solvent, and additional pressure (e.g., positive air pressure) to the partially cured material. A protective layer which has been formed from a partially hardened thermoplastic material may self-heal in the same manner. If, however, a protective layer is formed from a thermoplastic material which has substantially hardened, heat may be applied to at least selected regions of the protective layer, with or without external pressure (e.g., positive air pressure) to facilitate the healing of any delaminated areas thereof or cracks therein.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which depict various aspects of exemplary embodiments of the present invention:

FIGS. 1–4 depict an exemplary process according to the present invention, by which protective layers may be formed on semiconductor device components that are carried by a single fabrication substrate, or at a "wafer scale," and the semiconductor device components subsequently separated, or singulated or diced, from the fabrication substrate and one another to form so-called "chip-scale packages," then optionally treated to remedy any separation, or delamination, of the protective layer from the semiconductor device components;

FIGS. 5–8 depict another exemplary process that incorporates teachings of the present invention, in which score lines are formed between adjacent semiconductor device components following the disposition of a protective layer thereon, the protective layer may be treated to remedy any separation or delamination thereof from the semiconductor device components, and semiconductor device components are then fully separated, or singulated or diced, from one another;

DETAILED DESCRIPTION

With reference to FIGS. 1–4, an exemplary embodiment of a method for wafer-scale application of a protective layer substantially simultaneously onto upper or active surfaces 13 of a plurality of semiconductor device components 12 is depicted.

Figure 1:
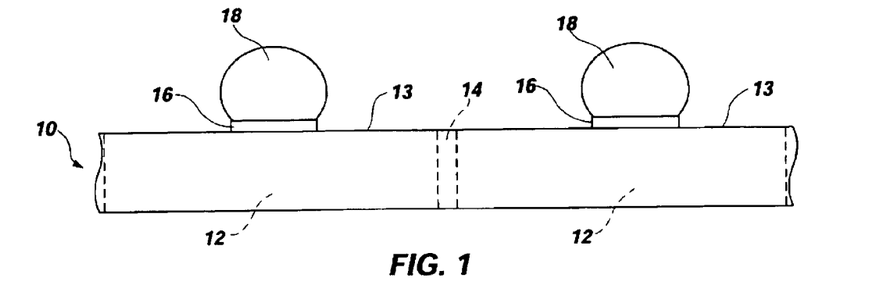
FIG. 1 is a cross-sectional representation of a fabrication substrate including a plurality of semiconductor device components thereon, with conductive structures protruding from contact pads of the semiconductor device components.

FIG. 1 depicts a fabrication substrate 10 upon which a plurality of semiconductor device components 12 has been fabricated. By way of example only, fabrication substrate 10 may comprise a full or partial wafer of semiconductive material (e.g., silicon, gallium arsenide, indium phosphide, etc.), a silicon-on-insulator (SOI) type substrate (e.g., silicon-on-ceramic (SOC), silicon-on-glass (SOG), silicon-on-sapphire (SOS), etc.), or any other bulk or large-scale substrate upon which a plurality of semiconductor device components may be fabricated. Each semiconductor device component 12 may comprise a semiconductor device, an interposer, a carrier substrate, or the like. Adjacent semiconductor device components 12 on fabrication substrate 10 are separated from one another by way of a street 14, which is depicted in phantom since each street 14 comprises material of fabrication substrate 10 which will not be removed until adjacent semiconductor device components 12 are to be partially or fully separated from one another.

As illustrated, each semiconductor device component 12 includes at least one contact pad 16, such as a bond pad of a semiconductor device or an interposer or a terminal of a carrier substrate. A conductive structure 18, such as a bump, ball, pillar, stud, or column formed from a metal, a metal alloy (e.g., solder), a conductor-filled elastomer, a conductive elastomer, or other suitable material for forming electrical connections, may be secured to and protrude from each contact pad 16. Of course, teachings of the present invention may also be used in forming protective layers on semiconductor device components or substrates that lack conductive structures and any other structures that protrude therefrom. Further, protective layers that are formed in accordance with teachings of the present invention need not include any apertures therethrough.

Figure 2:
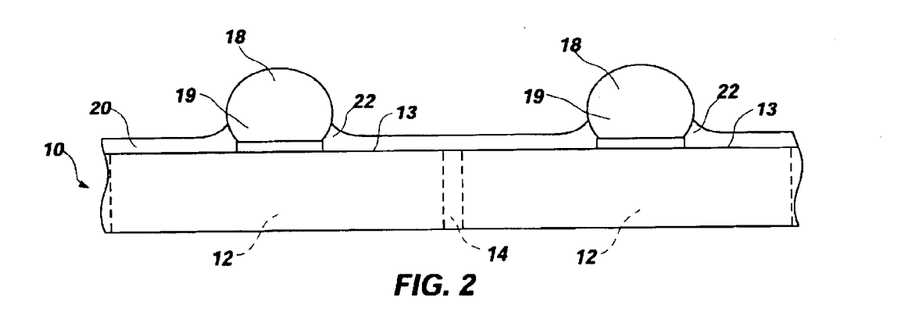
FIG. 2 is a cross-sectional representation of the fabrication substrate shown in FIG. 1, with a protective layer of polymeric material being disposed on an upper surface or active surface of the fabrication substrate.

As shown in FIG. 2, a protective layer 20 may be applied to upper or active surface 13 of each semiconductor device component 12. It is currently preferred that protective layer 20 be formed from a B-stage material or a thermoplastic material. Examples of B-stage materials that may be used to form protective layer 20 include, but are not limited to, MA-5 single component B-stage epoxy available from Epoxy Technology, Inc. of Billerica, Mass. Alternatively, an acrylic resin, a polyurethane resin, or any other suitable type of polymer may be used as the B-stage material. An exemplary thermoplastic material which is suitable for use in forming protective layer 20 has a melting temperature which exceeds the temperature to which semiconductor device component 12 will be heated during operation thereof or of adjacent components of an electronic device that includes semiconductor device component 12. Examples of thermoplastic polymers that may be used to form protective layer 20 include, without limitation, polyimides, polysulfones, polyetherimides, polyimide glass, reinforced nylon 6/6, polyesters, aromatic copolyesters, polyamide-imides, polyarylates, polypheylene sulfide, polyetherketone, and fluorocarbons. By way of example only, the material from which protective layer 20 is formed may have a modulus of about 20 MPa or greater once it is fully cured or hardened. Of course, a thermoplastic glass or any other type of thermoplastic material that would be suitable for use with semiconductor device component 12 may be used to form protective layer 20.

As shown, the material from which protective layer 20 is formed may be applied (e.g., by liquid dispense techniques, spray-on techniques, printing, etc.) to upper or active surface 13 of each semiconductor device component 12 carried by fabrication substrate 10 while the material is in liquid form. The liquid material may then be spread (e.g., by spin-on techniques, use of a roller or doctor blade, etc.) so as to substantially cover upper or active surfaces 13 of a plurality of semiconductor device components 12. Additionally, the surface tension of the liquid material may cause it to form a meniscus 22 that at least partially surrounds a base portion 19 of each conductive structure 18. As an example of the manner in which the liquid material may be spread to form protective layer 20, well-known spin-on techniques may be employed.

If protective layer 20 is formed from a B-stage material, it may be partially cured or cross-linked, such as by exposing the same to an elevated temperature (e.g., about 100° C.) if it is heat-curable (i.e., a thermoset resin) or exposing the material to an intensity of ultraviolet (UV) radiation for a duration that will result in only partial curing if the material is UV-curable. It is currently preferred that the curing or cross-linking of the B-stage material be effected to a degree which will facilitate cutting of the same (e.g., with a diamond-coated blade of a wafer saw) but will allow the material to continue to flow or be able to flow (e.g., by application of pressure, heat, solvent, etc. thereto) somewhat before being fully cured or cross-linked. Alternatively, solvent may be at least partially driven from a solution which includes a polymer dispersed within a solvent.

As an alternative to the use of a B-stage material, a thermoplastic material may be used to form protective layer 20. When a thermoplastic material is used to form protective layer 20, it may be heated to a molten, liquid form when dispensed and spread, then permitted to harden either partially or fully before cutting through the same.

Figure 3:
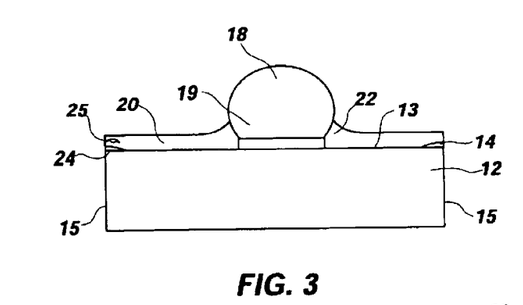
FIG. 3 is a cross-sectional representation of a single semiconductor device component that has been singulated, or diced, from other semiconductor device components that are carried by the fabrication substrate, the protective layer possibly including areas that have become separated, or delaminated, from the upper or active surface of the semiconductor device component or cracks.

As shown in FIG. 3, once protective layer 20 has been formed, fabrication substrate 10 (FIGS. 1 and 2) may be cut, severed, or diced, along streets 14 (FIGS. 1 and 2) thereof. Such cutting, severing, or dicing may be effected with a diamond-coated blade of a wafer saw or any other suitable instrument, as known in the art. When fabrication substrate 10 is cut, severed, or diced, adjacent semiconductor device components 12 carried thereby, including corresponding regions of protective layer 20 on upper or active surfaces 13 thereof, are separated from one another. When mechanical cutting means are employed to cut, sever, or dice fabrication substrate 10, areas 24 of protective layer 20 may be separated or become delaminated from upper or active surface 13 of the corresponding semiconductor device component 12. Likewise, cracks 25 may be formed in protective layer 20 during cutting, severing, or dicing thereof. Delaminated areas 24 and cracks 25 may be especially prevalent at regions of protective layer 20 which are located laterally adjacent to streets 14, or adjacent to the peripheral edges 15 of each semiconductor device component 12 that has been formed at a street 14, as these are the locations of protective layer 20 that are subjected to the greatest degree of mechanical stress when protective layer 20 and the underlying fabrication substrate 10 are cut, severed, or diced.

Figure 4:
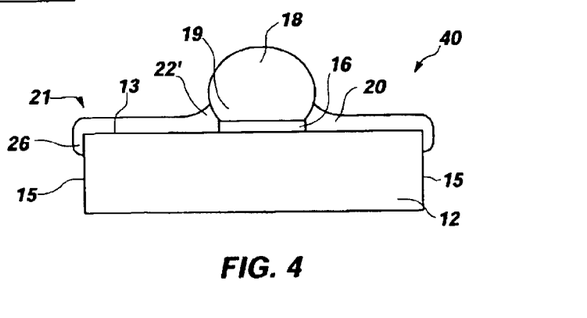
FIG. 4 is a cross-sectional representation of the semiconductor device component depicted in FIG. 3, with any separated or delaminated areas of the protective layer having been readhered to the upper or active surface and any cracks having been substantially healed.

Referring now to FIG. 4, when a B-stage material is employed as the material from which protective layer 20 is formed, delaminated areas 24 (FIG. 3) may be self-healed (i.e., automatically readhere to upper or active surface 13 of semiconductor device component 12) since the material from which protective layer 20 is formed is only partially cured. Likewise, any cracks 25 (FIG. 3) that were formed in protective layer 20 during the cutting, severing, or dicing process may self-heal. Such self-healing may be effected by the presence of solvent in the material alone. Optionally, heat and/or additional solvent may be applied to the B-stage material to reduce the viscosity thereof and thereby facilitate self-healing. As another option, additional force, such as a gentle positive pressure, may be applied to the material of protective layer 20 to facilitate self-healing of any delaminated areas 24 thereof or cracks 25 therein. Such healing may occur or be effected prior to or concurrently with the curing or further hardening of the material of protective layer 20.

Additionally, following the cutting, severing, or dicing process, the partially cured material from which protective layer 20 is formed may flow partially onto the upper portions of peripheral edges 15 (i.e., those portions of peripheral edges 15 which are nearest to upper or active surface 13) which were formed during the cutting, severing, or dicing process. Such flowing may occur without external influence or it may be effected by application of one or more of heat, solvent, and additional force (e.g., positive air pressure) to the partially cured material on at least the edges 21 of protective layer 20. The feature that results from such flowing is referred to herein as an "edge cover 26."

Figure 4A:
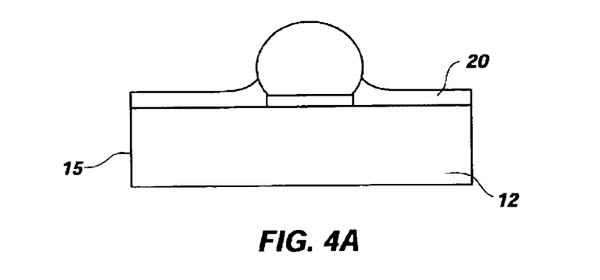
FIG. 4A is a cross-sectional representation of a variation of the semiconductor device component shown in FIG. 4.

Of course, as shown in FIG. 4A, a protective layer 20 of the present invention need not extend over the peripheral edges 15 of a semiconductor device component 12 to be within the scope of the present invention.

When delaminated areas 24 (FIG. 3) of protective layer 20 have been readhered to upper or active surface 13 of semiconductor device component 12 and any cracks 25 (FIG. 3) in protective layer 20 have been substantially healed, the material of protective layer 20 may be fully cured. Of course, the manner in which the material of protective layer 20 is fully cured depends upon the type of material employed to form protective layer 20. For example, if a thermoset-type B-stage material is used to form protective layer 20, the B-stage material may be exposed to additional heat to fully cure the same. As another example, if a UV-curable polymer is used to form protective layer 20, the UV-curable polymer may be exposed to a greater intensity or dosage of UV radiation than that used to partially cure the same or an additional exposure time may be used to fully cure the UV-curable polymer.

Alternatively, self-healing and curing or hardening may be effected substantially simultaneously. For example, if protective layer 20 comprises a thermally-curable B-stage material, healing may be effected as the B-stage material is heated to a sufficient temperature to further cure, or cross-link, the same. As another example, some B-staged UV-curable polymers may be further cured with heat, which may also reduce the viscosity thereof to facilitate healing as such materials are being cured.

In the case where a thermoplastic material is used to form protective layer 20, any delaminated areas 24 (FIG. 3) of protective layer 20 or cracks 25 (FIG. 3) therein may be self-healed prior to the full hardening (e.g., by cooling), or solidifying, of the thermoplastic material, as described above in reference to use of a B-stage material to form protective layer 20. Edge covers 26 may also be formed at the edges 21 of protective layer 20 and over the upper portions of peripheral edges 15 of semiconductor device components 12 before the thermoplastic material fully hardens, or solidifies.

Alternatively, a thermoplastic material may be reheated to facilitate healing of any delaminated areas 24 (FIG. 3) or cracks 25 (FIG. 3). Such reheating may be effected nonspecifically, by heating protective layer 20 in a general fashion (e.g., in an oven), or in a directed, or focused, manner (e.g., with a laser beam, electron beam, or other energy beam) toward edges 21 of protective layer 20. Edge covers 26 may be formed at the edges 21 of protective layer 20 and on the upper portions of peripheral edges 15 of semiconductor device component 12 during both nonspecific and directed, or focused, reheating of a protective layer 20 which is formed from a thermoplastic material.

As another alternative, a solvent or solution suitable for use with the polymer from which protective layer 20 is formed may be used to heal any delaminated areas 24 (FIG. 3) or cracks 25 (FIG. 3) that were formed in protective layer 20 during the cutting, severing, or dicing process.

With continued reference to FIG. 4, the resulting chip-scale package 40 includes a semiconductor device component 12 and a substantially defect-free protective layer 20 secured to at least a portion of the upper or active surface 13 of semiconductor device component 12. A conductive structure 18, which is secured to and in electrical communication with a contact pad 16 of semiconductor device component 12, may protrude through protective layer 20. When chip-scale package 40 includes one or more protruding conductive structures 18, support structures 22', which result from the formation of a meniscus 22 around base portion 19 of each conductive structure 18, may substantially surround base portion 19 and provide mechanical support for the same. An edge cover 26 of chip-scale package 40 may substantially cover the junction between peripheral edges 15 of semiconductor device component 12 and upper or active surface 13 thereof, preventing delamination of protective layer 20 therefrom, as well as at least partially protecting peripheral edges 15.

With continued reference to FIG. 4, the resulting chip-scale package 40 includes a semiconductor device component 12 and a substantially defect-free protective layer 20 secured to at least a portion of the upper or active surface 13 of semiconductor device component 12. A conductive structure 18, which is secured to and in electrical communication with a contact pad 16 of semiconductor device component 12, may protrude through protective layer 20. When chip-scale package 40 includes one or more protruding conductive structures 18, support structures 22', which result from the formation of a meniscus 22 around base portion 19 of each conductive structure 18, may substantially surround base portion 19 and provide mechanical support for the same. An edge cover 26 of chip-scale package 40 may substantially cover the junction between peripheral edges 15 of semiconductor device component 12 and upper or active surface 13 thereof, preventing delamination of protective layer 20 therefrom, as well as at least partially protecting peripheral edges 15.

Figure 5:
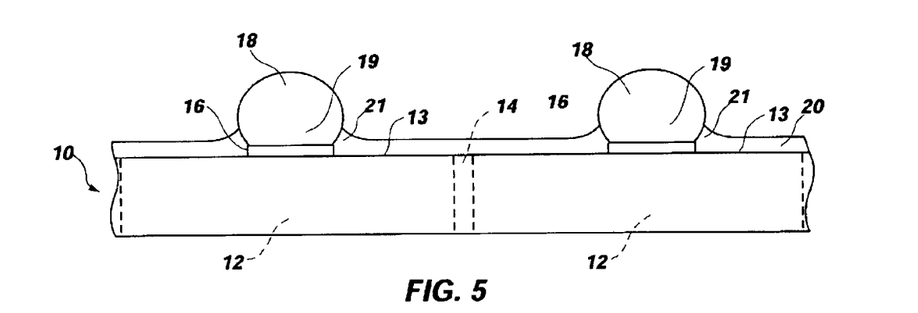
FIG. 5 is a cross-sectional representation of a fabrication substrate that carries a plurality of semiconductor device components, each including at least one contact pad and a conductive structure secured to and protruding from that contact pad, adjacent semiconductor device components being separated from one another by way of a street that extends therebetween.

In FIG. 5, a fabrication substrate 10 is depicted as including a plurality of yet-to-be singulated semiconductor device components 12, a street 14 between semiconductor device components 12, conductive structures 18 secured to and protruding from contact pads 16 on upper or active surfaces 13 of semiconductor device components 12, and a protective layer 20 formed on upper or active surfaces 13. Protective layer 20 forms a meniscus 22 around and substantially surrounding a base portion 19 of each conductive structure 18. Protective layer 20 may be applied to upper or active surface 13 of each semiconductor device component 12 as described above in reference to FIG. 2.

Figure 6:
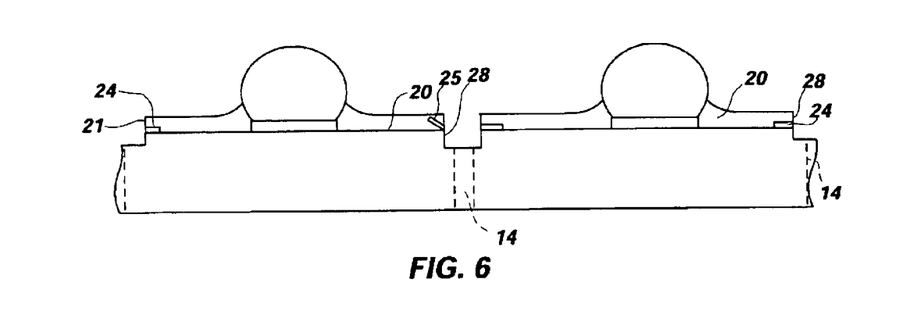
FIG. 6 is a cross-sectional representation of the fabrication substrate shown in FIG. 5 following the disposition of a protective layer on an upper or active surface thereof and the partial singulation, or scoring, of the protective layer and the fabrication substrate along the streets that are located between adjacent semiconductor device components, as well as the separation or cracking of the protective layer, which may occur during the scoring process.

Once the material from which protective layer 20 is formed has been sufficiently (either partially or fully) cured or hardened, an initial scribe line 28 may be formed completely through protective layer 20 at a region which is located over a street 14, as shown in FIG. 6. Initial scribe line 28 also extends partially through fabrication substrate 10 at street 14. By way of example and not to limit the scope of the present invention, initial scribe line 28 may be formed by use of a diamond-coated blade of a wafer saw.

When mechanical cutting means are used to form one or more initial scribe lines 28, areas 24 of protective layer 20, particularly those located at edges 21 and, thus, laterally adjacent to street 14, may become separated, or delaminated from upper or active surface 13 of semiconductor device component 12. Also, cracks 25 may be formed in protective layer 20, most likely at edges 21 thereof.

Figure 7:
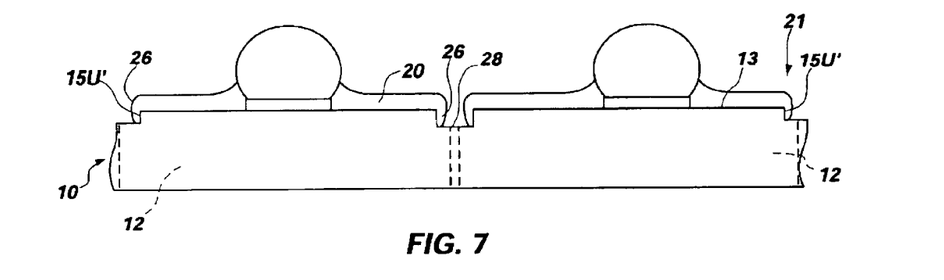
FIG. 7 is a cross-sectional representation of the fabrication substrate illustrated in FIG. 6, following readherence of the protective layer to any regions of the upper or active surface of the fabrication substrate and semiconductor device components carried thereon from which the protective layer has separated, or become delaminated, and substantial healing of any cracks that may have formed in the protective layer.

FIG. 7 shows that any areas 24 (FIG. 6) of protective layer 20 that have become separated from upper or active surface 13 of semiconductor device component 12 and any cracks 25 (FIG. 6) in protective layer 20 have been substantially healed. Such healing may be effected as described above in reference to FIG. 4. In addition, the material of protective layer 20 may flow or be caused to flow onto upper peripheral edge 15U', which is formed during the formation of initial scribe line 28, to form an edge cover 26 thereon and at edges 21 of protective layer 20. The formation of edge cover 26 may occur or be effected in the same fashion as that described above in reference to FIG. 4.

Figure 7A:
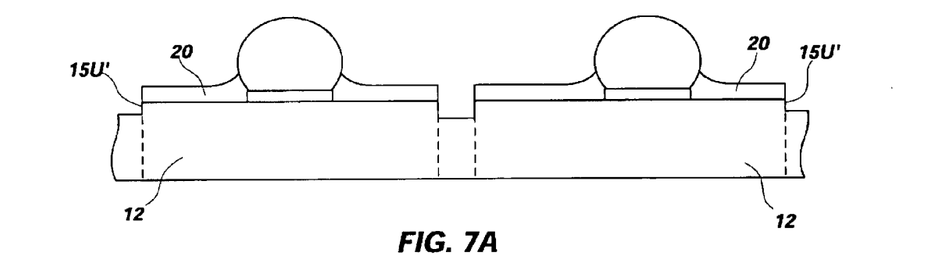
FIG. 7A is a cross-sectional representation of a variation of the fabrication substrate depicted in FIG. 7.

Alternatively, as shown in FIG. 7A, a protective layer 20 that is formed in accordance with teachings of the present invention need not extend onto or cover any portion of an upper peripheral edge 15U' of a semiconductor device component 12.

Figure 8:
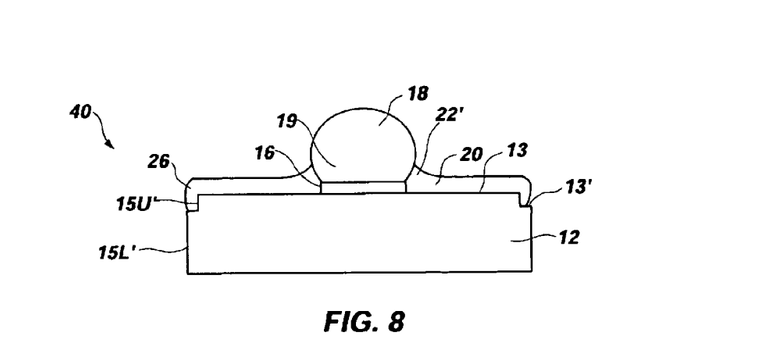
FIG. 8 is a cross-sectional representation of a semiconductor device component that has been singulated, or diced, from the fabrication substrate and adjacent semiconductor device components of FIG. 7.

Once the material from which protective layer 20 is formed has healed and has been fully cured, in the case of B-stage materials, or hardened, in the case of thermoplastic materials, fabrication substrate 10 may be further and fully cut, severed, or diced, as shown in FIG. 8. Of course, such cutting, severing, or dicing should be effected in a manner that will prevent disturbing edge covers 26 on semiconductor device components 12 that are positioned on opposite sides of a street 14 (FIGS. 5 and 6) and, thus, the possibility for causing delamination of protective layer 20 from upper or active surface 13 or upper peripheral edge 15U' of semiconductor device component 12 or the occurrence of cracks 25 (FIG. 6) in protective layer 20. Such cutting, severing, or dicing may, by way of example, be effected with a blade of a wafer saw which has a narrow enough width and may be positioned with sufficient accuracy that neither of the opposing edge covers 26 will be contacted thereby.

As each semiconductor device component 12 is fully cut, severed, or diced from fabrication substrate 10, lower peripheral edges 15L' thereof are formed. As depicted, lower peripheral edges 15L' are located laterally beyond the locations of their corresponding upper peripheral edges 15U'. A ledge 13', which is formed by the bottom of initial scribe line 28 and is oriented substantially parallel to upper or active surface 13, is located laterally and vertically (relative to the height of semiconductor device component 12) between and joins each lower peripheral edge 15L' and its corresponding upper peripheral edge 15U'.

The result of such cutting, severing, or dicing is a chip-scale package 40' which includes a semiconductor device component 12 and a protective layer 20 covering and adhered to at least a portion of an upper or active surface 13 of semiconductor device component 12. If one or more conductive structures 18 protrude from contact pads 16 of semiconductor device component 12, protective layer 20 may include a support structure 22' that substantially surrounds a base portion 19 of each conductive structure 18.

Additionally, protective layer 20 may include an edge cover 26 which extends substantially around a peripheral edge of upper or active surface 13, may contact at least an upper portion of upper peripheral edge 15U', and extends at least partially over and may contact ledge 13'. If, in the alternative, a protective layer 20 lacks an edge cover, as shown in FIG. 7A, the finished structure may resemble that shown in FIG. 4A.

Figure 9:
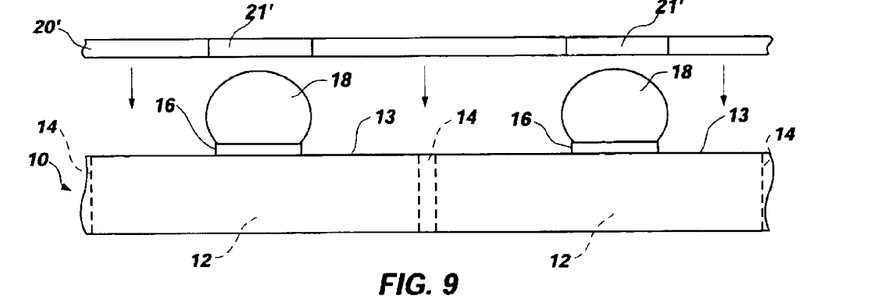
FIGS. 9 and 10 depict another exemplary method for forming a protective layer on a fabrication substrate prior to the singulation, or dicing, of individual semiconductor device components therefrom, in which a preformed sheet of polymeric material including preformed apertures is secured to an upper or active surface of the fabrication substrate.
Figure 10:
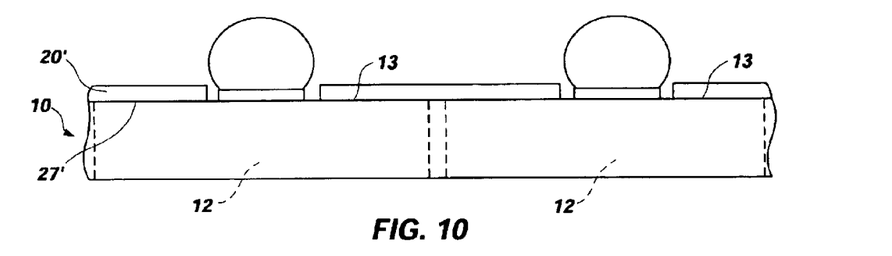

Another example of a method for applying protective layers 20' to a plurality of semiconductor device components at a wafer-scale is illustrated in FIGS. 9 and 10.

FIG. 9 depicts a fabrication substrate 10 like that shown in FIG. 1. Fabrication substrate 10 includes a plurality of semiconductor device components 12 which are separated from one another by streets 14. Each semiconductor device component 12 includes at least one contact pad 16 to facilitate electrical communication with circuitry (not shown) carried by semiconductor device component 12 (e.g., integrated circuitry in the case of a semiconductor device). A conductive structure 18 may, as depicted, be secured to and protrude from each contact pad 16. Alternatively, contact pads 16 of semiconductor device components 12 that are carried by fabrication substrate 10 may not yet have conductive structures 18 secured thereto.

Also shown in FIG. 9 is a preformed protective layer 20', which includes a plurality of apertures 21' that extend through the thickness thereof. At least some of apertures 21' are positioned and sized to receive conductive structures 18 or so that contact pads 16 may be exposed therethrough as preformed protective layer 20' is positioned on and secured to upper or active surfaces 13 of a plurality of semiconductor device components 12.

As a nonlimiting example, preformed protective layer 20' may comprise a substantially planar sheet which has been formed from a partially cured or otherwise B-staged B-stage material (e.g., a temperature curable polymer, such as a thermoset resin, a UV-curable polymer, or a polymer-solvent solution) or from a thermoplastic material (e.g., a thermoplastic polymer, a thermoplastic glass, etc.).

Optionally, once preformed protective layer 20' has been positioned on upper or active surfaces 13 of semiconductor device components 12, it may be permitted or caused to spread, such as over portions thereof which are shadowed by conductive structures 18. When preformed protective layer 20' is formed from a partially cured B-stage material, such spreading may occur by allowing preformed protective layer 20' to sit for a period of time prior to further curing the same. Alternatively, force may be applied thereto, such as positive air pressure, the B-stage material may be heated, the B-stage material may be exposed to a solvent, or a combination of the foregoing may be effected to facilitate spreading of the B-stage material. If preformed protective layer 20' comprises a thermoplastic material, it may be caused to spread, for example, by the nonspecific or focused application of heat.

Referring now to FIG. 10, preformed protective layer 20' is depicted as being secured to upper or active surfaces 13 of a plurality of semiconductor device components 12. Preformed protective layer 20' may be secured to upper or active surfaces 13 by way of a suitable adhesive material (e.g., a thermally-curable or UV-curable adhesive material) (not shown), which will withstand the operational temperatures of semiconductor device component 12 or any other electronic componentry to be positioned near preformed protective layer 20'. Such an adhesive material may be applied to one or both of upper or active surfaces 13 and a corresponding surface 27' of preformed protective layer 20' by any suitable method known in the art (e.g., by spraying, spreading, rolling, etc.).

Alternatively, preformed protective layer 20' may be formed from a somewhat tacky, partially cured B-stage material. The tackiness of such a partially cured material facilitates adherence of preformed protective layer 20' to upper or active surfaces 13 of semiconductor device components 12. A more permanent bond between preformed protective layer 20' and upper or active surface 13 may be subsequently formed when the partially cured B-stage material is further cured or fully cured.

As another example of the manner in which preformed protective layer 20' may be secured to upper or active surfaces 13, when preformed protective layer 20' is formed from a thermoplastic material, heat may be applied to either or both of preformed protective layer 20' and fabrication substrate 10 to at least partially tackify, or soften, surface 27' of preformed protective layer 20' as surface 27' contacts upper or active surfaces 13 of semiconductor device components 12 that are carried by fabrication substrate 10. Examples of the manner in which heat may be applied include, but are not limited to, use of an oven, supporting fabrication substrate 10 upon a heated platen, and directing heat onto surface 27' just prior to placing the same against upper or active surfaces 13.

Once preformed protective layer 20' has been properly positioned over semiconductor device components 12 and secured to upper or active surfaces 13 thereof, preformed protective layer 20' and semiconductor device components 12 may be cut, severed, or diced and any areas 24 (FIGS. 3 and 6) thereof which have become separated, or delaminated, from upper or active surfaces 13 and any cracks 25 (FIGS. 3 and 6) that have formed therein may be healed, such as by one of the exemplary processes described above in reference to FIGS. 3 and 4 or FIGS. 6–8.

Figure 11:
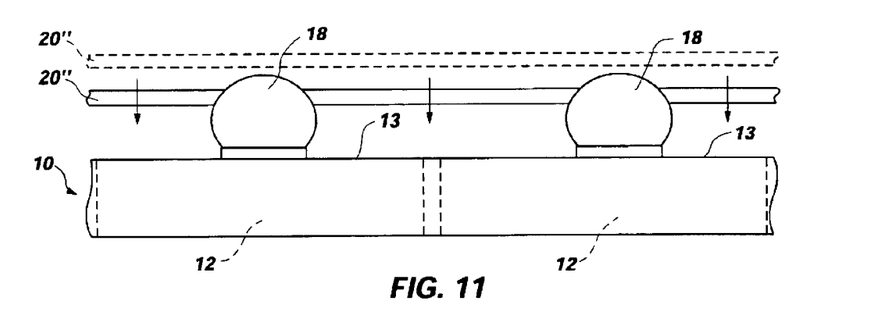
FIGS. 11 and 12 depict a variation of the embodiment of the method shown in FIGS. 9 and 10, with apertures being formed through the preformed sheet of polymeric material as it is positioned over the upper or active surface of the fabrication substrate.
Figure 12:
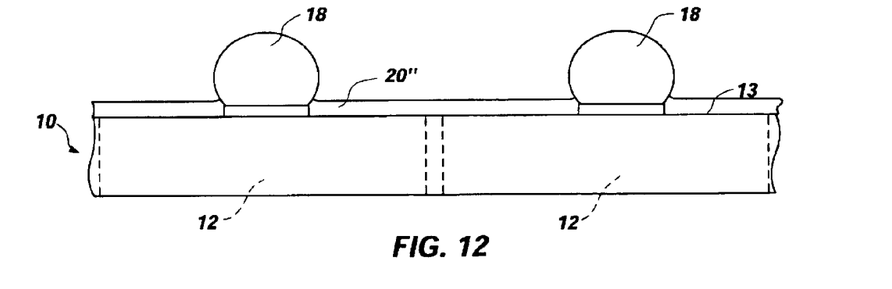

With reference now to FIGS. 11 and 12, yet another exemplary method for applying a protective layer 20" simultaneously to a plurality of semiconductor device components 12 is shown. The method shown in FIGS. 11 and 12 is similar to that shown in and described in reference to FIGS. 9 and 10 in that protective layer 20" comprises a preformed, substantially planar sheet or film of polymeric material.

The method of FIGS. 11 and 12 differs from that shown in and described with reference to FIGS. 9 and 10 in that preformed protective layer 20" lacks any apertures. Instead, as shown in FIG. 11, preformed protective layer 20" is positioned over semiconductor device components 12 that are carried by fabrication substrate 10 as conductive structures 18 that protrude from contact pads 16 of each semiconductor device component 12 are forced through preformed protective layer 20". By way of example only, at least conductive structures 18 may be heated to facilitate their passage through preformed protective layer 20". The temperature to which conductive structures 18 are heated should be sufficient to "burn through" or "melt through" the material of preformed protective layer 20" (e.g., a partially cured B-stage material, thermoplastic material, etc.) without altering the shapes of conductive structures 18 in an undesirable manner. Conductive structures 18 may, by way of example only, be heated by placing the assembly of fabrication substrate 10, semiconductor device components 12, and conductive structures 18 on a heated platen while or just before preformed protective layer 20" is positioned on upper or active surfaces 13. As another example, the assembly may be placed in an oven to heat conductive structures 18 to a suitable temperature, then, shortly after the assembly has been removed from the oven, preformed protective layer 20" may be positioned on upper or active surfaces 13 of semiconductor device components 12.

Preformed protective layer 20" may then be permitted or caused to spread somewhat over upper or active surfaces 13 of semiconductor device components 12, as described with reference to FIG. 9.

Once preformed protective layer 20" covers the desired locations of upper or active surfaces 13, it may be secured thereto, for example, by one of the processes described above in reference to FIG. 10.

Next, preformed protective layer 20" and semiconductor device components 12 may be cut, severed, or diced from one another and any areas 24 (FIGS. 3 and 6) of preformed protective layer 20" that have become separated, or delaminated, from upper or active surfaces 13 or that have cracks 25 (FIGS. 3 and 6) therein may be healed, such as by the processes described above in reference to FIGS. 3 and 4 or by the processes that have been described with reference to FIGS. 6–8.

Again, the results of such a process are chip-scale packages 40, 40' or other semiconductor device components which include protective layers 20, 20', 20" that are substantially free of any separated, or delaminated, areas 24 and cracks 25.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed:

1. A chip-scale package, comprising:
    a semiconductor device;
    a protective layer secured to a surface of the semiconductor device, covering at least a portion of the surface, extending to a lateral periphery of the semiconductor device, and including at least one healed region that is substantially free of cracks and delamination.

2. The chip-scale package of claim 1, wherein the semiconductor device includes at least one bond pad on the surface.

3. The chip-scale package of claim 2, wherein the at least one bond pad is exposed through the protective layer sufficiently to effect electrical contact therewith.

4. The chip-scale package of claim 3, further comprising:
    a conductive structure secured to the at least one bond pad, the conductive structure protruding through the protective layer.

5. The chip-scale package of claim 4, wherein the protective layer contacts a base portion of the conductive structure.

6. The chip-scale package of claim 5, wherein the protective layer forms a support structure around the base portion of the conductive structure.

7. The chip-scale package of claim 4, wherein the protective layer is spaced apart from an outer periphery of a base of the conductive structure.

8. The chip-scale package of claim 4, wherein the conductive structure comprises at least one of a metal, a metal alloy, a conductive elastomer, and a conductor-filled elastomer.

9. The chip-scale package of claim 1, wherein the protective layer forms an edge cover over at least a portion of a periphery of the semiconductor device.

10. The chip-scale package of claim 9, wherein the edge cover is located substantially around the periphery.

11. The chip-scale package of claim 1, wherein the semiconductor device includes a ledge substantially around a periphery thereof.

12. The chip-scale package of claim 11, wherein the protective layer forms an edge cover substantially over at least a portion of the periphery.

13. The chip-scale package of claim 12, wherein the edge cover is positioned over the ledge.

14. The chip-scale package of claim 13, wherein the edge cover does not extend beyond an outer periphery of the semiconductor device.

15. The chip-scale package of claim 1, wherein the protective layer comprises a partially cured polymer.

16. The chip-scale package of claim 15, wherein the partially cured polymer comprises a B-stage material.

17. The chip-scale package of claim 1, wherein the protective layer comprises a fully cured polymer.

18. The chip-scale package of claim 17, wherein the fully cured polymer comprises a B-stage material.

19. The chip-scale package of claim 1, wherein the protective layer comprises a thermoplastic material.

20. An intermediate semiconductor device structure, comprising:
- a fabrication substrate carrying a plurality of semiconductor device components, with at least one street between adjacent semiconductor device components of the plurality of semiconductor device components, the at least one street having a lower elevation than corresponding surfaces of the adjacent semiconductor device components; and
- a protective layer including a plurality of regions that substantially cover a surface of a corresponding semiconductor device component of the adjacent semiconductor device components, the at least one street being exposed between adjacent regions of the plurality of regions of the protective layer, each region of the plurality of regions being substantially free of cracks and delaminated areas.

21. The intermediate semiconductor device structure of claim 20, wherein each of the adjacent semiconductor device components comprises at least one bond pad exposed through a corresponding region of the protective layer sufficiently to effect electrical contact therewith.

22. The intermediate semiconductor device structure of claim 21, further comprising:
- a conductive structure secured to the at least one bond pad of each of the adjacent semiconductor device components, the conductive structure protruding through each corresponding region of the protective layer.

23. The intermediate semiconductor device structure of claim 22, wherein each corresponding region of the protective layer contacts a base portion of the conductive structure.

24. The intermediate semiconductor device structure of claim 23, wherein each corresponding region of the protective layer forms a support structure around the base portion of the conductive structure.

25. The intermediate semiconductor device structure of claim 22, wherein each corresponding region of the protective layer is spaced apart from an outer periphery of a base of the conductive structure.

26. The intermediate semiconductor device structure of claim 22, wherein the conductive structure comprises at least one of a metal, a metal alloy, a conductive elastomer, and a conductor-filled elastomer.

27. The intermediate semiconductor device structure of claim 20, wherein the protective layer forms an edge cover over a portion of the at least one street.

28. The intermediate semiconductor device structure of claim 27, wherein the edge cover extends substantially around a periphery of each semiconductor device component of the adjacent semiconductor device components.

29. The intermediate semiconductor device structure of claim 20, wherein the protective layer comprises a partially cured polymer.

30. The intermediate semiconductor device structure of claim 29, wherein the partially cured polymer comprises a B-stage material.

31. The intermediate semiconductor device structure of claim 20, wherein the protective layer comprises a fully cured polymer.

32. The intermediate semiconductor device structure of claim 31, wherein the fully cured polymer comprises a B-stage material.

33. The intermediate semiconductor device structure of claim 20, wherein the protective layer comprises a thermoplastic material.

* * * * *